(12) United States Patent
Yeh et al.

(10) Patent No.: US 8,497,475 B2
(45) Date of Patent: Jul. 30, 2013

(54) METHOD AND APPARATUS FOR CHARGED PARTICLE BEAM INSPECTION

(75) Inventors: Chang Chun Yeh, Hsinchu (TW); Shih-Tsuan Chang, Hsinchu (TW)

(73) Assignee: Hermes-Microvision, Inc., Hsinchu (TW)

( * ) Notice: Subject to any disclaimer, the term of this patent is extended or adjusted under 35 U.S.C. 154(b) by 0 days.

(21) Appl. No.: 13/288,563

(22) Filed: Nov. 3, 2011

(65) Prior Publication Data

US 2012/0043462 A1    Feb. 23, 2012

Related U.S. Application Data

(63) Continuation of application No. 12/400,757, filed on Mar. 9, 2009, now Pat. No. 8,063,363.

(51) Int. Cl.
*G01N 23/00* (2006.01)
(52) U.S. Cl.
USPC ........................... 250/306; 250/307; 250/310
(58) Field of Classification Search
USPC .................................................. 250/306
See application file for complete search history.

(56) References Cited

U.S. PATENT DOCUMENTS

| 5,578,821 | A | * | 11/1996 | Meisberger et al. | 250/310 |
| 7,095,022 | B2 | * | 8/2006 | Nakasuji et al. | 250/310 |
| 7,248,353 | B2 | * | 7/2007 | Kimba et al. | 356/237.4 |
| 7,468,506 | B2 | * | 12/2008 | Rogers et al. | 250/234 |

\* cited by examiner

*Primary Examiner* — Phillip A Johnston
(74) *Attorney, Agent, or Firm* — WPAT, PC; Justin King

(57) ABSTRACT

A method, apparatus and computer readable medium for charged particle beam inspection of a sample comprising at least one sampling region and at least one skip region is disclosed. The method, apparatus and computer readable medium comprise receiving an imaging recipe which at least comprises information of the area of the sampling and skip regions; calculating a default stage speed according to the imaging recipe; calculating an alternative stage speed at least according to the default stage speed, the sampling region area information, and the skip region area information; calculating at least one imaging scan compensation offset at least according to the alternative stage speed; and inspecting the sample at the alternative stage speed while adjusting the motion of the charged particle beam according to the imaging scan compensation offsets, such that the charged particle beam tightly follows the motion of the stage and images only the sampling regions on the sample.

36 Claims, 16 Drawing Sheets

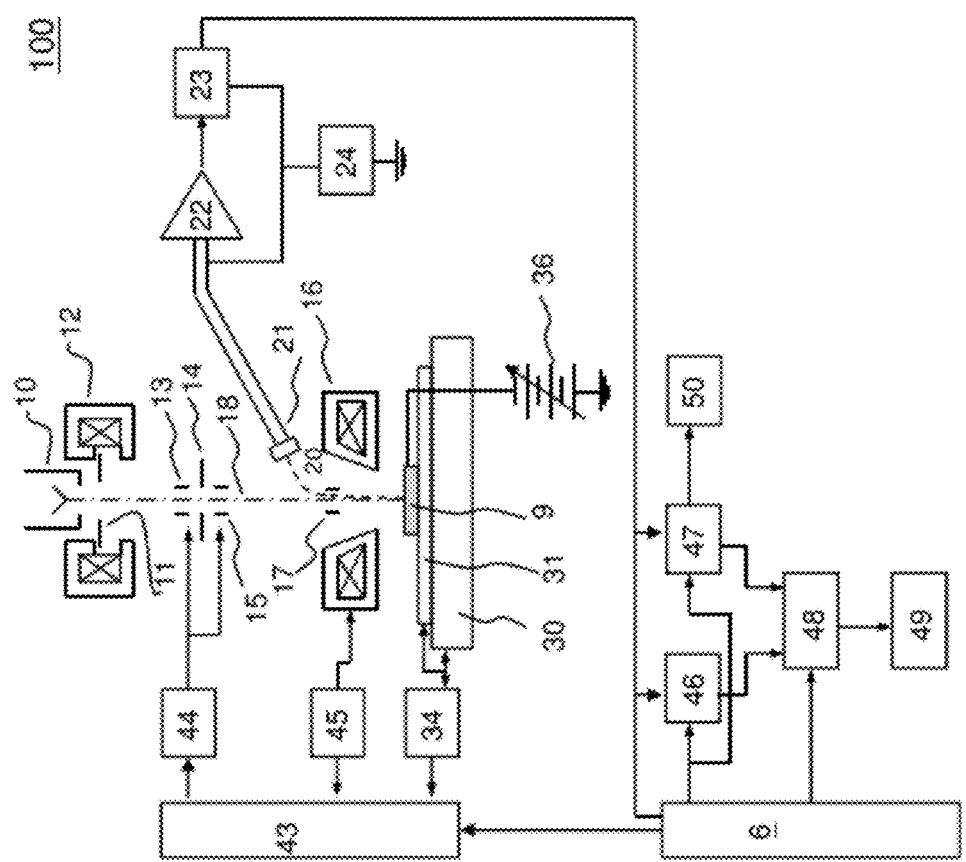
(Prior art) FIG 1

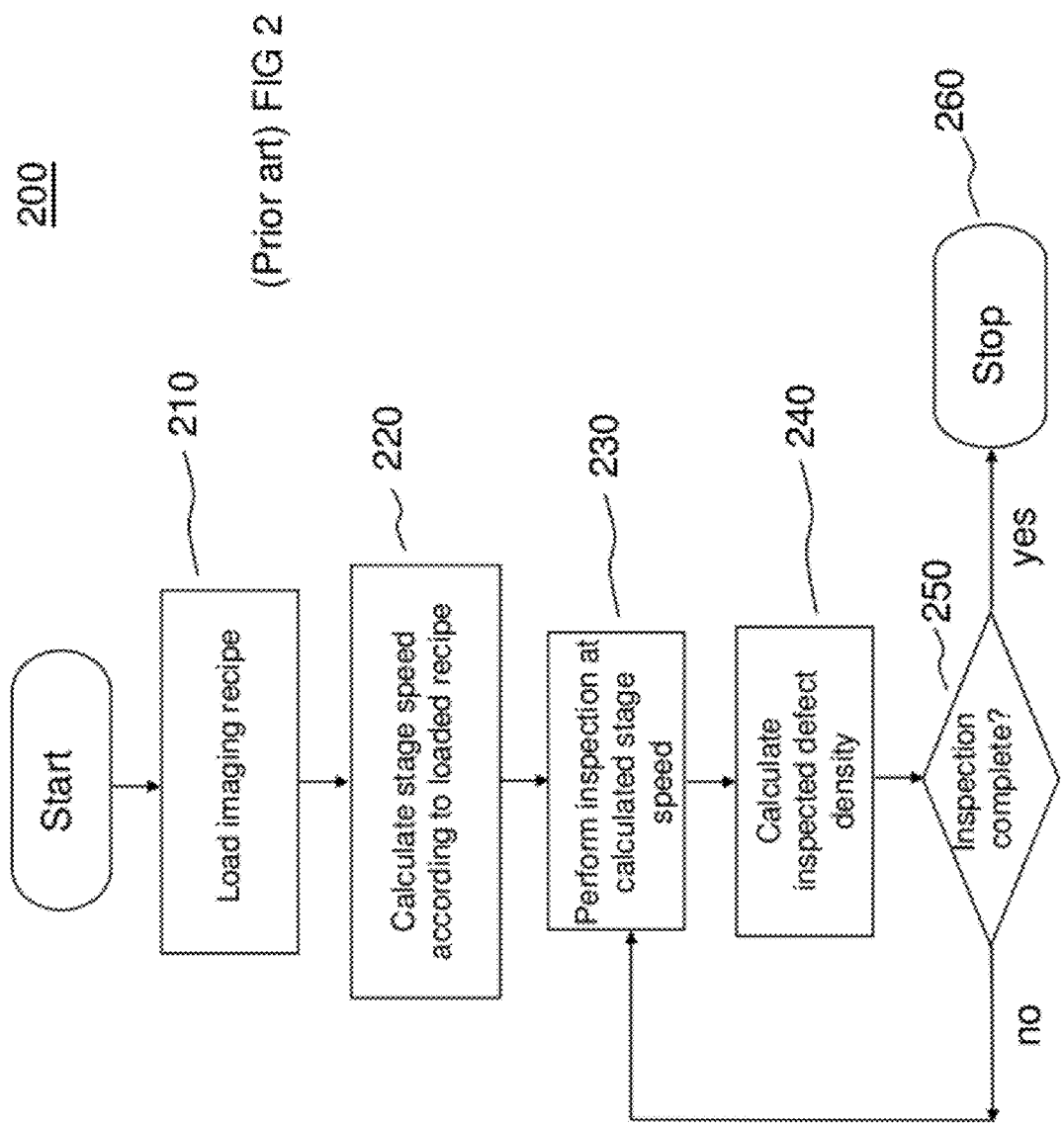

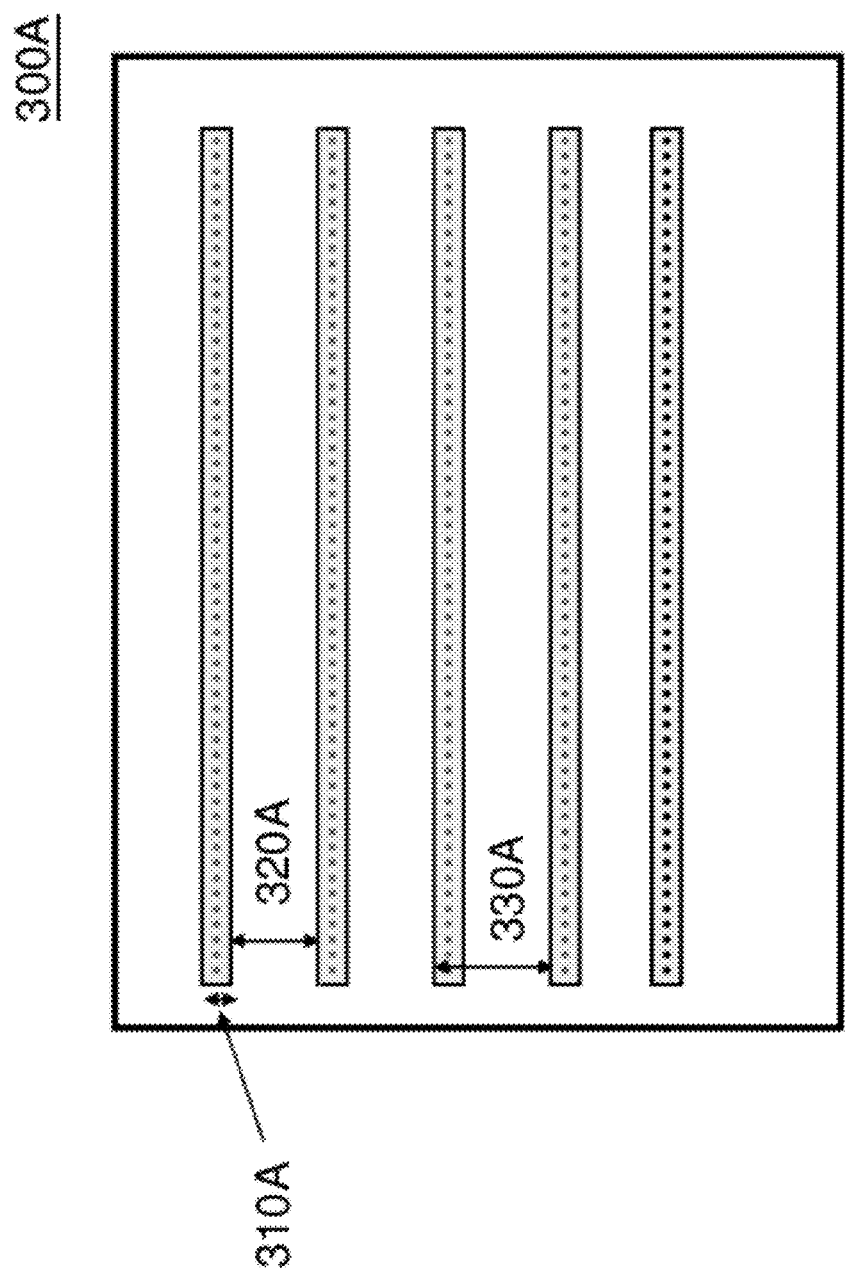

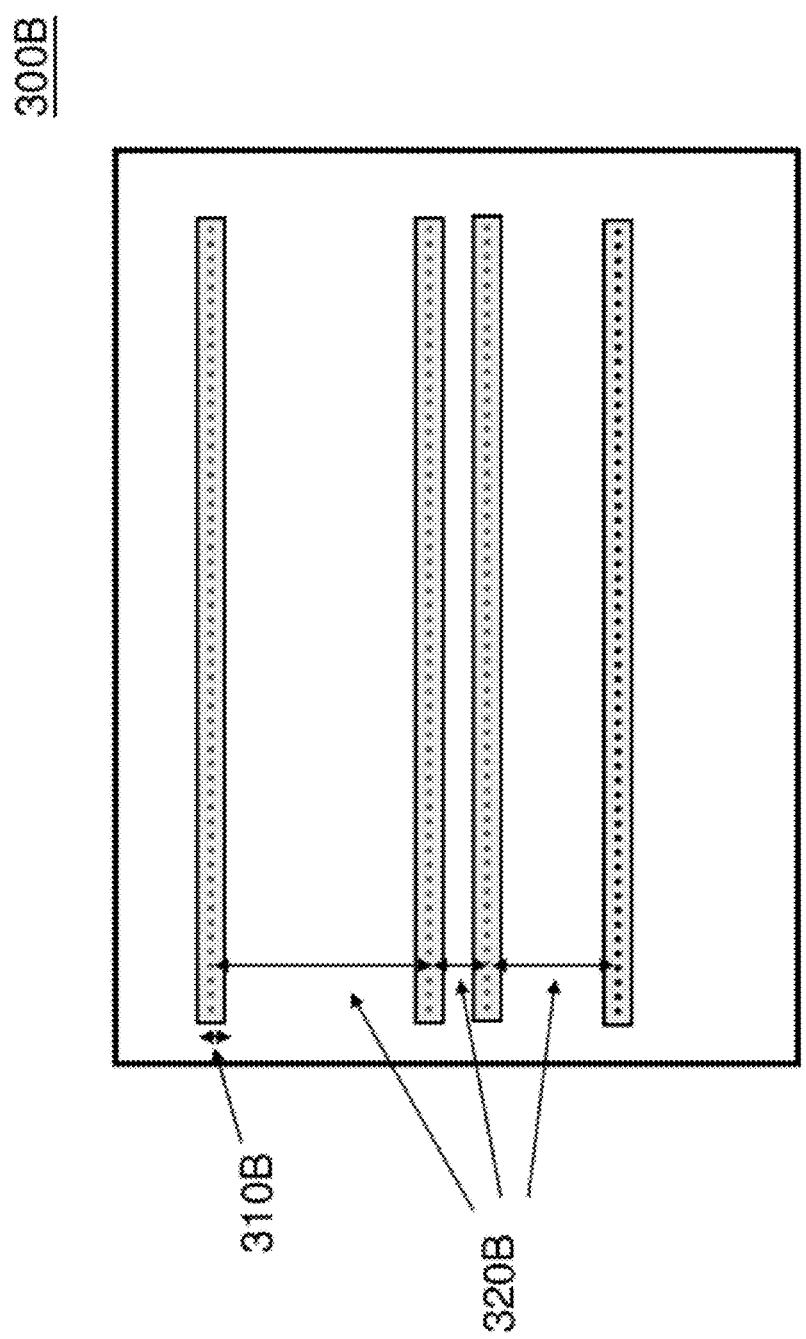
(Prior art) FIG 3B

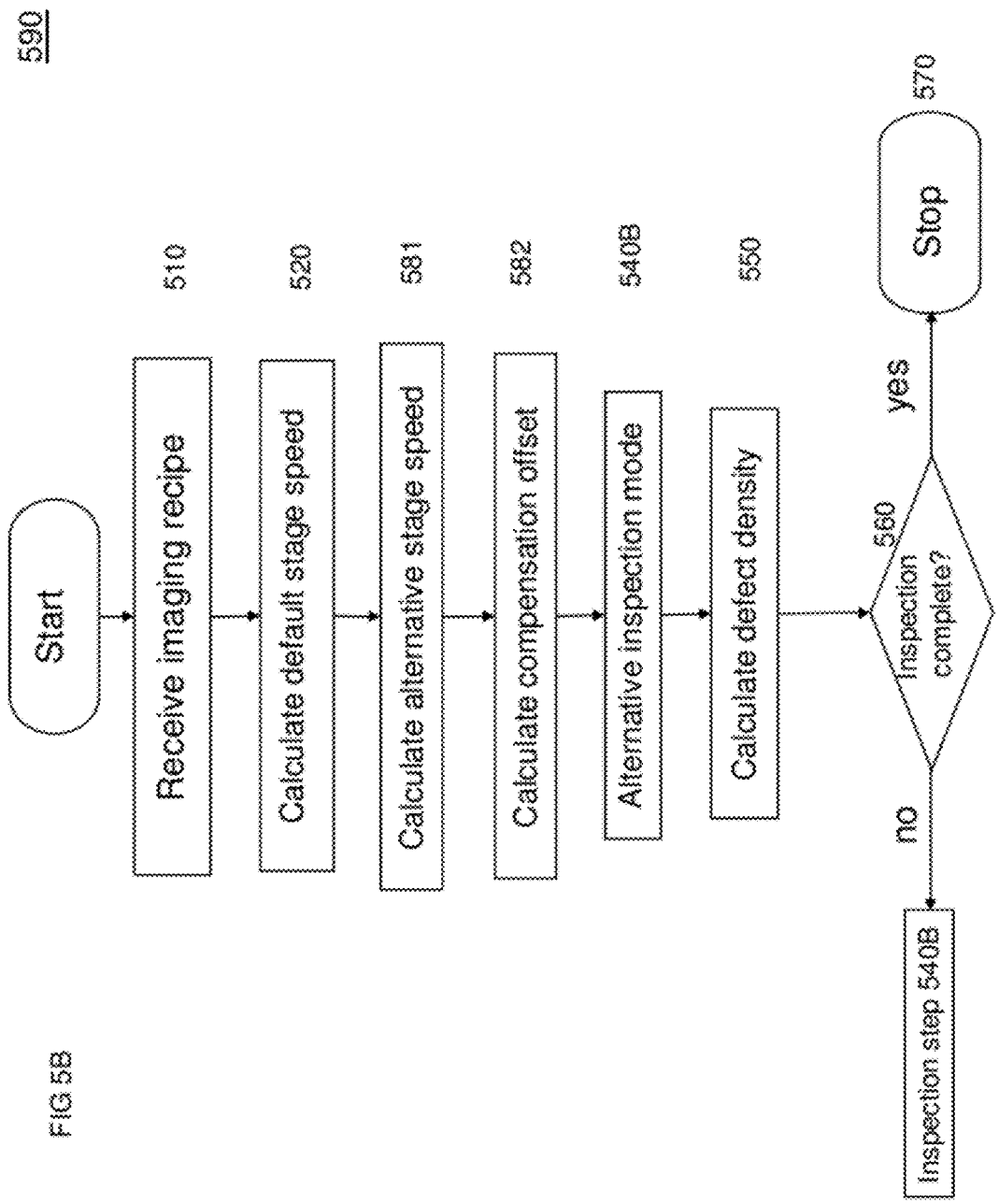

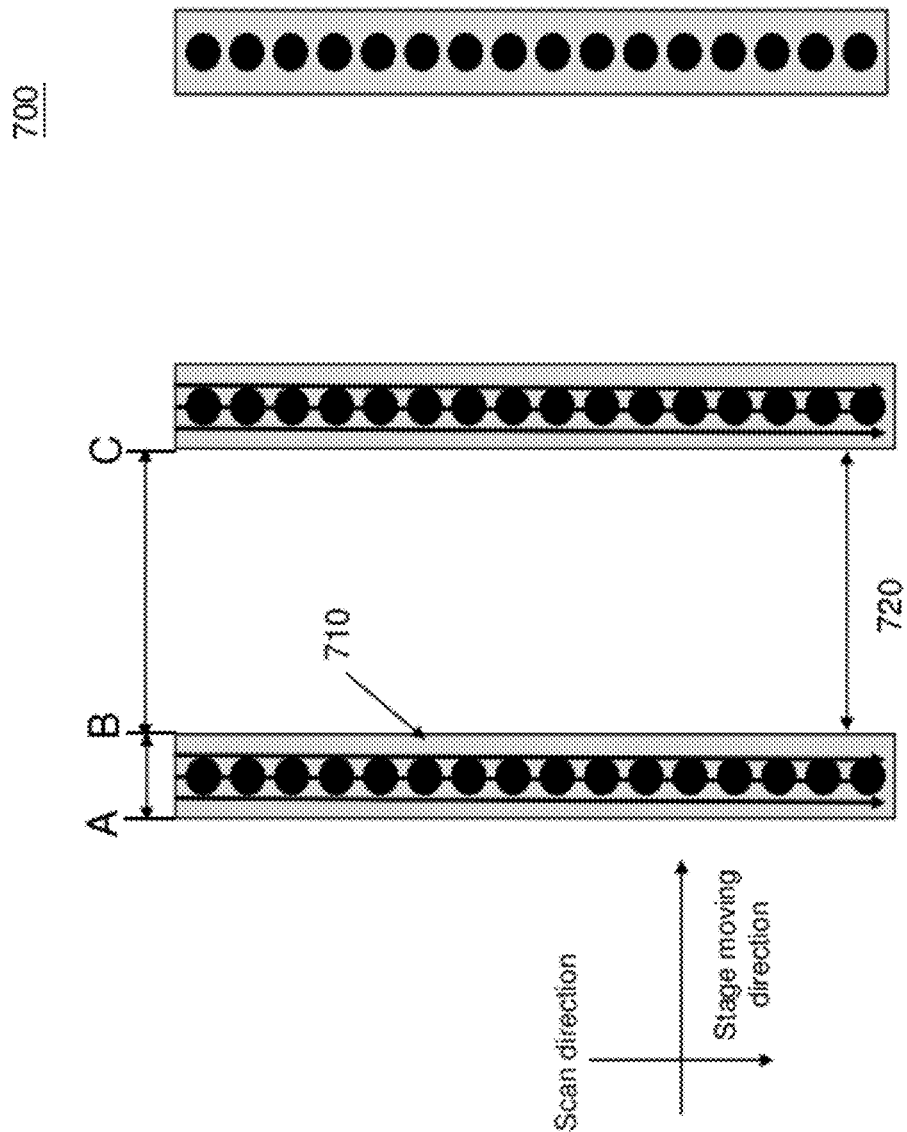

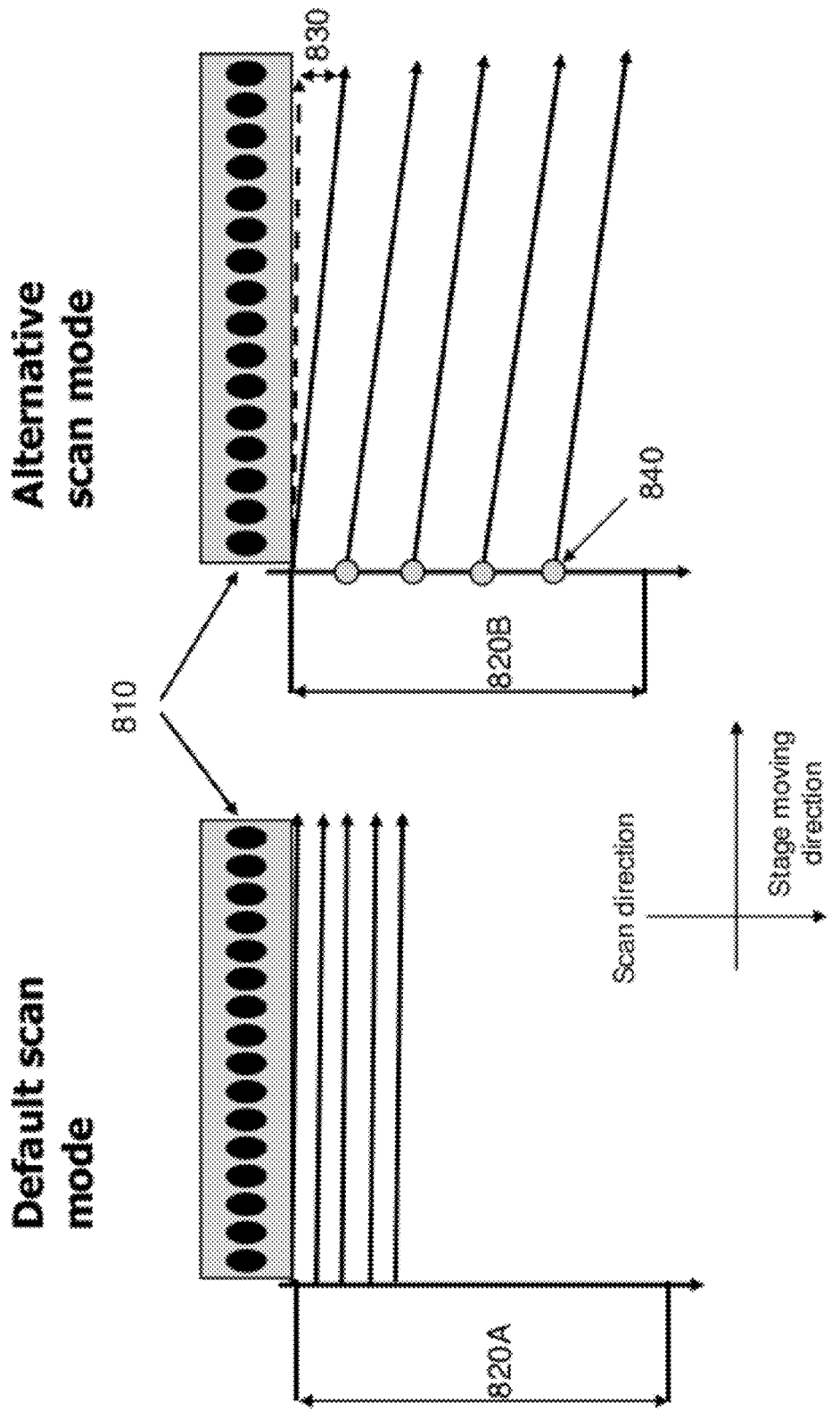

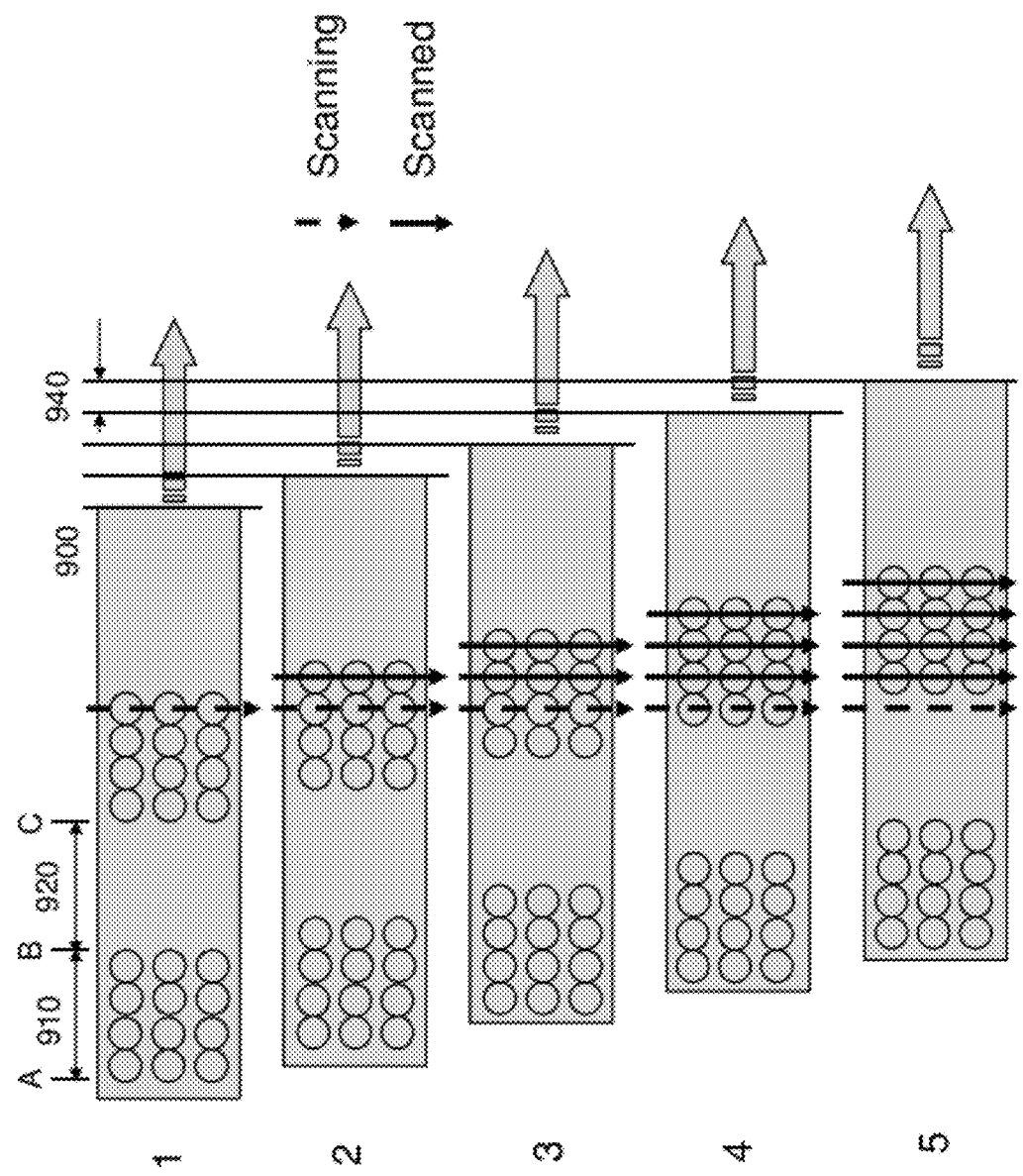

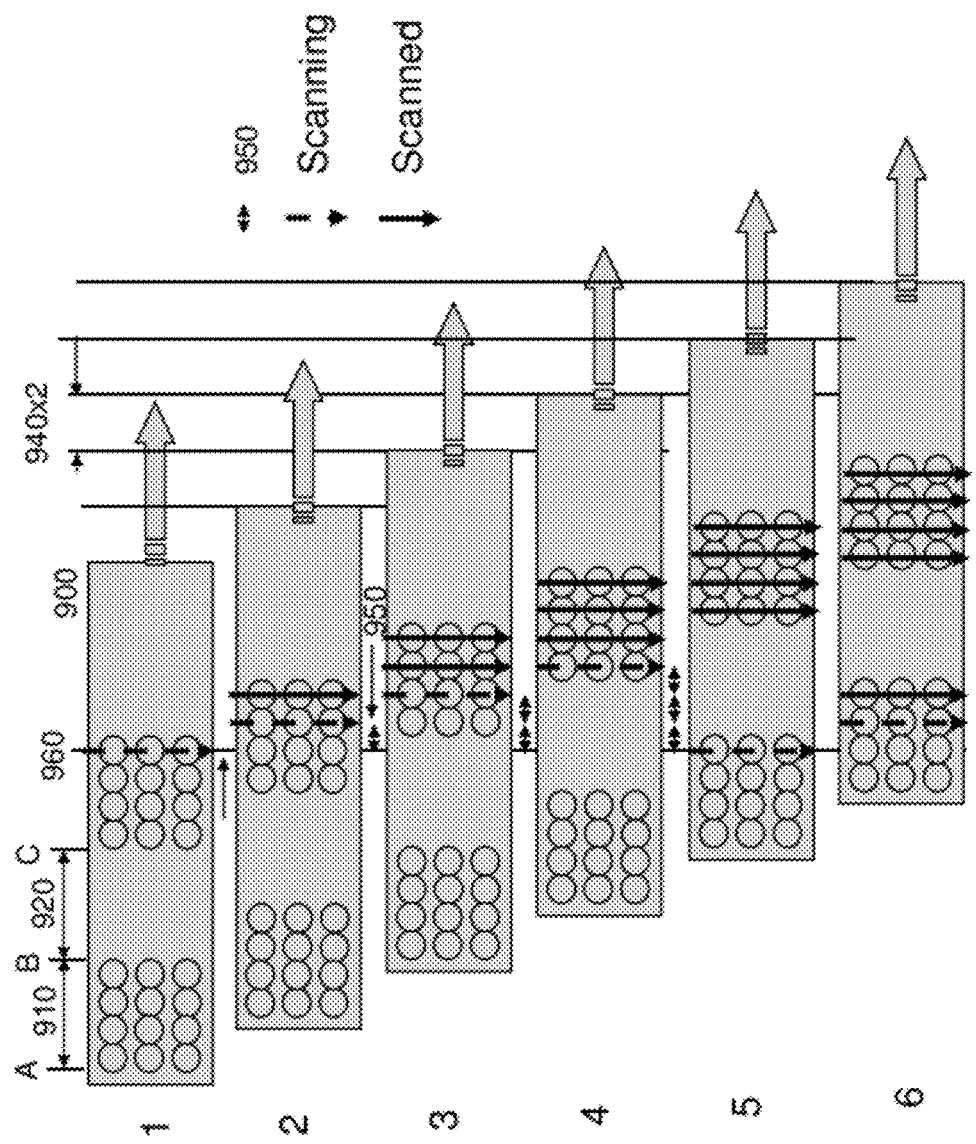

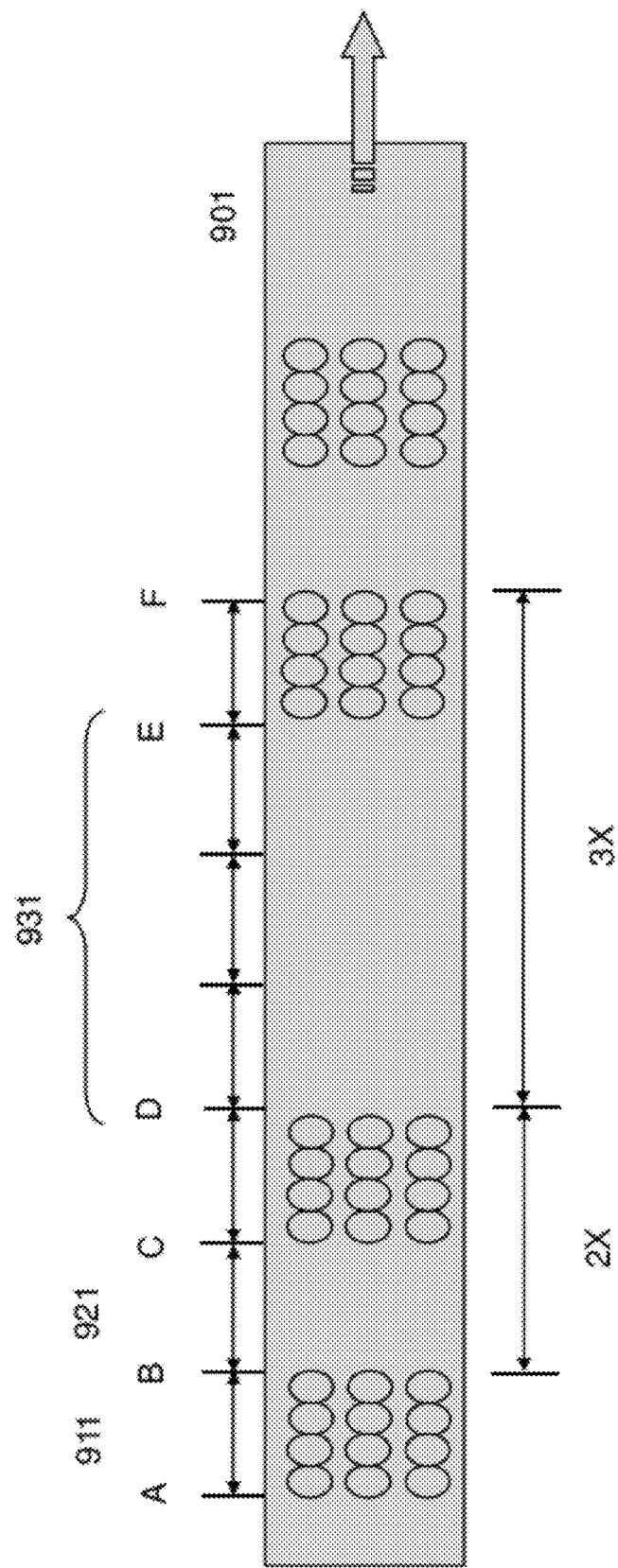

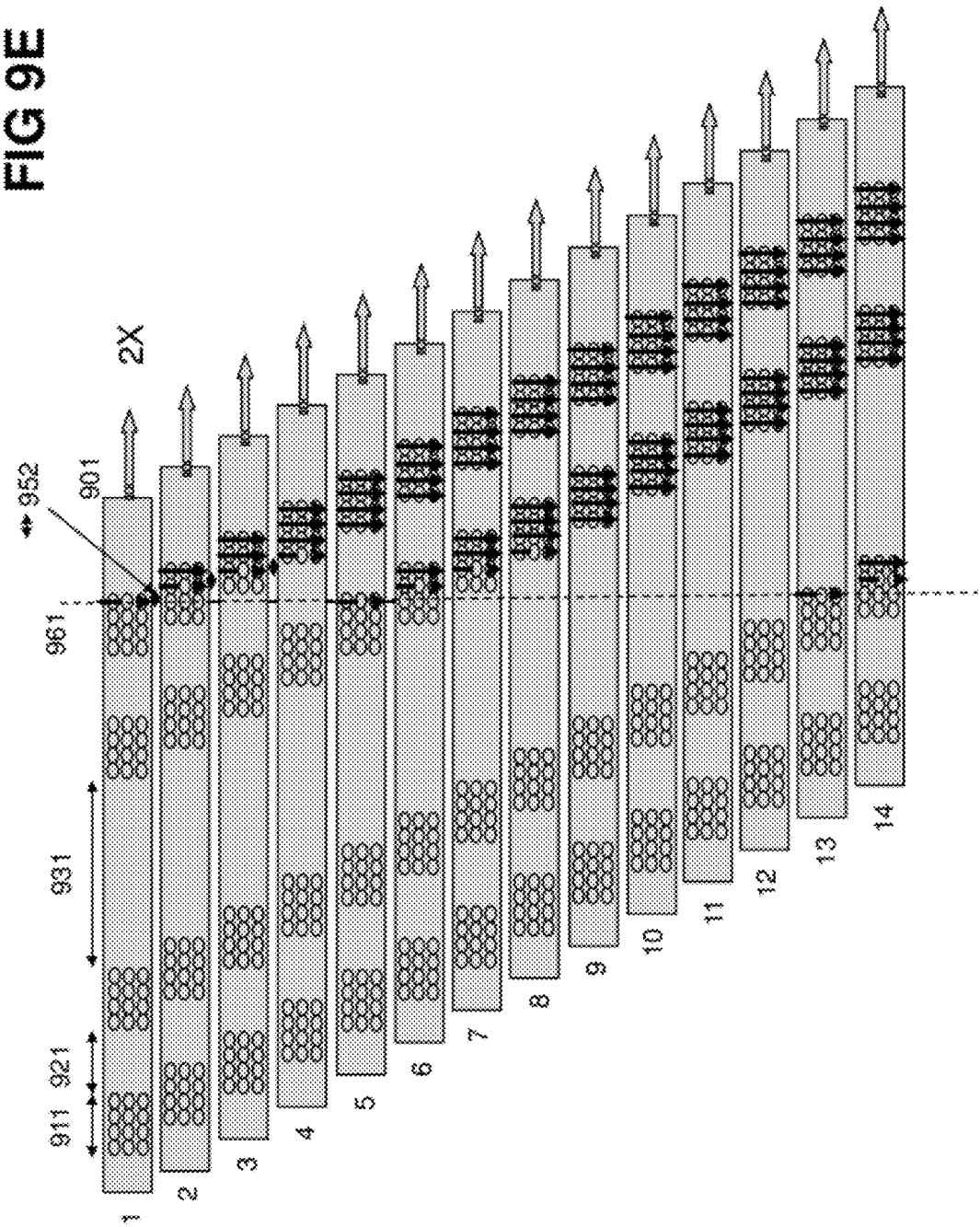

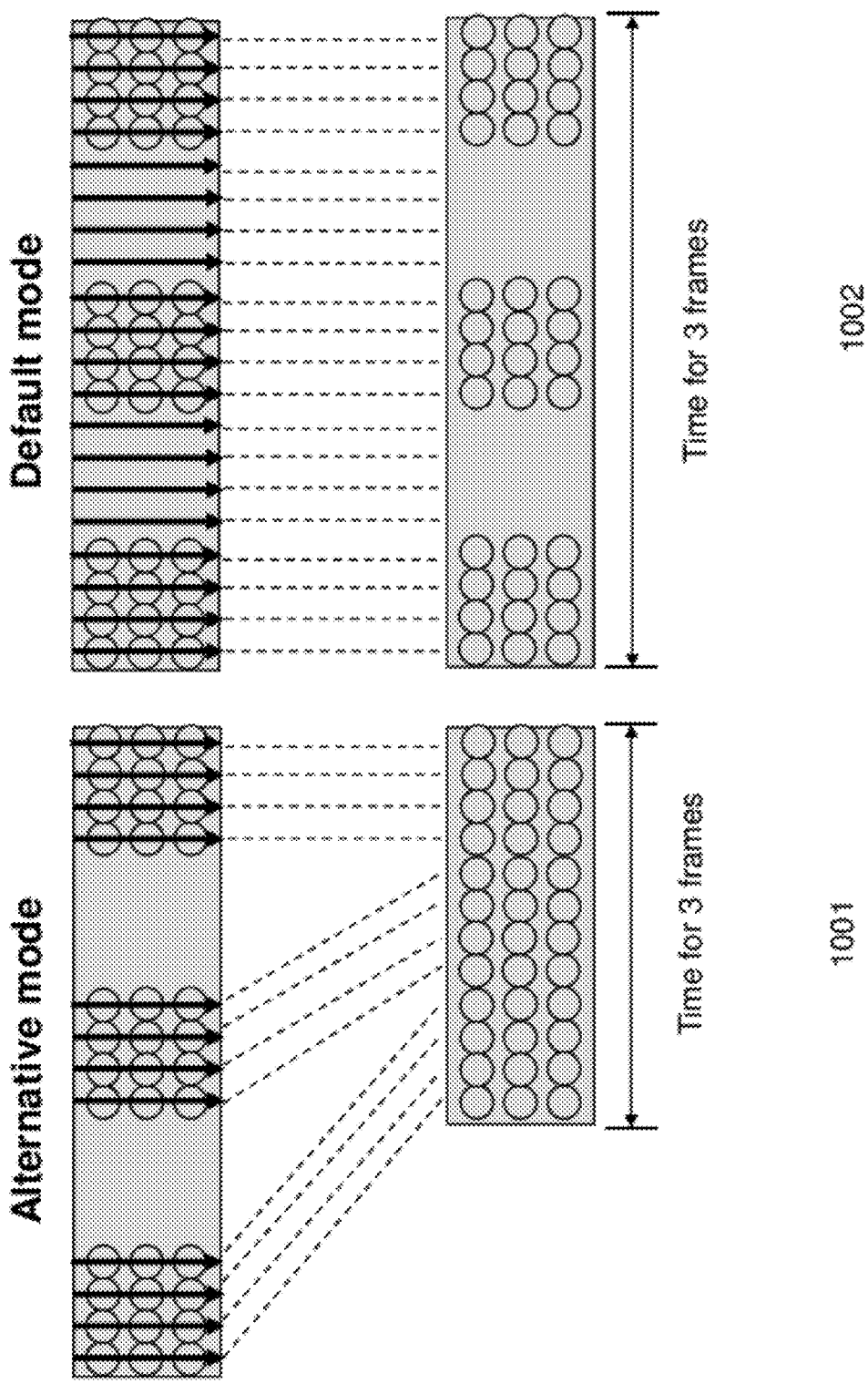

METHOD AND APPARATUS FOR CHARGED PARTICLE BEAM INSPECTION

CROSS-REFERENCES TO RELATED APPLICATIONS

Under 35 USC§120, this application is a continuation application and claims priority to U.S. application Ser. No. 12/400,757 filed Mar. 9, 2009 which is incorporated herein by reference.

FIELD OF THE INVENTION

The present invention relates to charged particle beam defect inspection, and more particularly to a method and apparatus thereof for fast charged particle beam inspection of defects in a sample.

BACKGROUND OF THE INVENTION

The charged particle beam inspection system has been widely used for the inspection of physical or electrical defects in a semiconductor wafer or mask. FIG. 1 is a schematic illustration of a conventional charged particle beam defect inspection system 100. System 100 includes several portions, namely, a primary charged particle beam source portion, a secondary charged particle detection portion, an image processing portion, and a system control portion.

The primary charged particle beam source portion includes a charged particle gun 10, a beam extraction electrode 11, a condenser lens 12, a beam blanking deflector 13, an aperture 14, a scanning deflector 15, and an objective lens 16. The secondary charged particle detection portion includes an E×B charged particle detour device 17, a secondary charged particle detector 21, a preamplifier 22, an A/D converter 23, and a high voltage electric source 24.

The image processing portion includes a first image storage 46, a second image storage 47, an arithmetic operation device 48 for comparing images from storage 46 and 47, a defect judgment device 49, and a monitor display 50 for interfacing with the users. The system control portion includes a microprocessor computer 6, a position correction and control circuit 43, a stage driver 34, an objective lens source 45, a scan signal generator 44, a sample stage 30, an X-Y direction stage 31, and a high voltage electric source 36.

The inspection process begins as a sample 9 (for example, a wafer or a mask) sitting on the sample stage 30 is irradiated by a primary charged particle beam 18. The secondary charged particles 20 emanating from the sample 9 is detoured by the E×B charged particle detour device 17 to the detector 21, the charged particle signal is then amplified by the amplifier 22 and converted to digital signals by the A/D converter 23 for further image processing and defect judgment. In accordance with a preloaded recipe in the firmware, the microprocessor computer 6 guides the stage driver 34 and scan signal generator 44 to properly deliver the inspection.

The throughput of the defect inspection process is particularly critical when such inspection is part of the semiconductor manufacturing process flow. It is usually necessary to be able to measure the defect density in a shorter time for high-efficiency production flow. Referring to FIG. 2, which is a flowchart illustration of a conventional defect inspection process 200. First, an imaging recipe is loaded, for example from the firmware, in step 210. The imaging recipe is a group of parameters carrying inspection specifications such as the graphical data system (GDS) file of the sample being inspected, the location and area of the sampling regions (regions on the sample that are interested in and to be inspected for defects), image pixel size, scan width, image scan time, the largest available image pixel size, the number of scans for individual sampling region, etc. It is noted that the sampling regions are generally selected in a fashion which complies with the statistical process control rule. Next, in step 220, a moving speed for the sample stage is calculated based on the loaded imaging recipe. This is especially important for a continuous scanning mode inspection operation. Then, the inspection is performed at the calculated stage speed and according to the specifications indicated in the imaging recipe, as shown in step 230. Then, in step 240, the density of inspected defects from step 230 is calculated. The calculation result is evaluated in step 250 to determine whether it meets satisfaction, so as to determine completion of the inspection. If the inspection is determined to be incomplete, the process goes back to step 230 and down. If the inspection is determined to be complete, the process ends at step 260.

The overall defect density inspection throughput typically scales as a function of the square of the pixel size used. For example, if the linear dimension of the image pixel size is halved in order to be able to find smaller defects, the overall inspection speed decreases by a factor of four assuming the pixel data rate (sampled pixels per unit time, for example in seconds) remains constant.

The square law dependence that throughput has on the image pixel size is critical for advanced higher resolution inspection systems such as a charged particle inspection system, where the frequent need to use smaller pixels slows the inspection speed significantly. The slow speeds of high resolution defect inspection, combined with the fact that minimum sample surface area must be inspected to make a statistically significant measurement of defect density, results in inefficient use of inspection system time.

This problem is especially significant when the sample comprises patterns composed of both interested and uninterested regions, or simply say that the sample comprises interested and uninterested regions. For example, when a functional device has been developed, it is typically desired to have immediate report of possible defects thereof. However, these devices often coexist with other common devices which are equally inspected in the conventional inspection method.

A similar problem may happen in a scenario where a newly developed fabrication method of an existing common device is to be verified by means of defect inspection. Further, it is also possible for a sample to have complete blank regions where no pattern is formed at all. In these cases, the inspection performed on those regions other than the interested region obviously lowers the overall throughput.

Referring to FIG. 3A, which illustrates an exemplary pattern having both interested and uninterested regions. The "interested regions" are substantially equal to the sampling regions in the conventional art mentioned earlier, and will be continued to be referred to as the sampling regions hereinafter for consistency. The uninterested region on the other hand, is a region which is not interested in and preferred to be skipped for the purpose of time saving, and will be referred as a skip region hereinafter. As shown, a target pattern 300A comprises an interested sampling region 310A and an uninterested skip region 320A. It is noted that the target pattern 300A in this example is a repeating pattern, and the sampling region 310A combined with the skip region 320A form a pattern period 330A.

FIG. 3B illustrates another exemplary pattern having both sampling regions and skip regions. As shown, an irregular target pattern 300B comprises a sampling region 310B and a skip region 320B, and no pattern period is present in this example. It is noted that in either case in FIGS. 3A and 3B, the uninterested skip region typically has a much larger area than the interested sampling region.

For example, the sampling region may be of a few hundreds nanometers (nm) in width, while the skip region may be of a few micrometers (um) in width. As a result, much of the tool time is wasted scanning the uninterested skip regions for the conventional art inspection method as in which both regions are equally scanned and imaged.

Accordingly what is needed is an inspection method that allows for increased inspection throughput without sacrificing resolution during inspection of the sample.

SUMMARY OF THE PRESENT INVENTION

In one embodiment of the present invention, a method for imaging and inspecting a sample using a charged particle beam is disclosed. The sample comprises at least one sampling region and at least one skip region thereon. The charged particle beam scans the sample in scan lines along a first direction. The sample is secured on a stage continuously moving along a second direction. The disclosed method comprises receiving an imaging recipe; calculating a default stage speed; calculating an alternative stage speed; calculating at least one imaging scan compensation offset; and inspecting the sample at the alternative stage speed while adjusting the motion of the charged particle beam according to the calculated imaging scan compensation offsets, such that the charged particle beam tightly follows the motion of the stage and scans and images only the sampling regions on the sample. The received imaging recipe at least comprises information of the area of the sampling regions and the skip regions. The default stage speed is calculated according to the received imaging recipe. The alternative stage speed is calculated at least according to the calculated default stage speed, the sampling region area information, and the skip region area information. The imaging scan compensation offsets are calculated at least according to the calculated alternative stage speed.

In another embodiment of the present invention, a computer readable medium encoded with a program for enhancing throughput of charged particle beam inspection of a sample is disclosed. The sample comprises at least one sampling region and at least one skip region thereon. The charged particle beam scans the sample in scan lines along a first direction. The sample is secured on a stage continuously moving along a second direction. The disclosed program executes actions comprising: receiving an imaging recipe; calculating a default stage speed; calculating an alternative stage speed; calculating at least one imaging scan compensation offset; and determining activation of an alternative inspection mode, wherein if the alternative inspection mode is determined to be activated, then the program images the sample at the alternative stage speed while adjusting the motion of the charged particle beam according to the calculated imaging scan compensation offsets, such that the charged particle beam tightly follows the motion of the stage and scans and images only the sampling regions on the sample. The imaging recipe at least comprises information of the area of the sampling regions and the skip regions. The default stage speed is calculated according to the received imaging recipe. The alternative stage speed is calculated at least according to the calculated default stage speed, the sampling region area information, and the skip region area information. The imaging scan compensation offsets are calculated at least according to the calculated alternative stage speed.

In yet another embodiment of the present invention, a charged particle beam inspection system for imaging and inspecting a sample is disclosed. The sample comprises at least one sampling region and at least one skip region thereon. The disclosed charged particle beam inspection system comprises: a charged particle beam probe generator; a deflection module; a moving stage; a control module coupled with the stage and the deflection module. The charged particle beam probe generator generates a charged particle beam probe. The deflection module scans the generated charged particle beam probe across a surface of the sample, wherein the charged particle beam probe scans the sample in scan lines along a first direction. The sample is secured on the stage for imaging, wherein the stage continuously moves along a second direction. The control module functions to match the relative motion of the stage and the charged particle beam probe.

The control module performs the following actions: receiving an imaging recipe; calculating a default stage speed; calculating an alternative stage speed; calculating at least one imaging scan compensation offset and generating a first control signal and a second control signal accordingly; and determining activation of an alternative inspection mode, wherein if the alternative inspection mode is determined to be activated, then the control module outputs the generated second control signal to the stage and deflection module to cause the stage to move at the alternative stage speed and the deflection module to guide the charged particle beam probe in accordance with the imaging scan compensation offsets, such that the charged particle beam probe tightly follows the motion of the stage and scans and images only the sampling regions on the sample. The received imaging recipe at least comprises information of the area of the sampling region and the skip region. The default stage speed is calculated according to the received imaging recipe. The alternative stage speed is calculated at least according to the calculated default stage speed, the sampling region area information, and the skip region area information. The imaging scan compensation offsets are calculated at least according to the calculated alternative stage speed. The sampling area is selected complying with the statistical process control rule.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a schematic illustration of a conventional charged particle beam defect inspection system.

FIG. 2 is a flowchart illustration of a conventional defect inspection process.

FIG. 3A is a schematic illustration of an exemplary pattern having both interested and uninterested regions.

FIG. 3B is a schematic illustration of another exemplary pattern having both sampling regions and skip regions.

FIG. 5B is a flow chart illustration of execution of an alternative inspection mode operation in accordance with an embodiment of the present invention.

FIG. 7 is a schematic illustration of determination of alternative stage speed in accordance with one embodiment of the present invention.

FIG. 8 is a schematic illustration of example compensation offsets in accordance of an embodiment of the present invention.

FIG. 9A is a schematic illustration of a default inspection mode operation in accordance with an embodiment of the present invention.

FIG. 9B, which is a schematic illustration of an alternative inspection mode operation in accordance with an embodiment of the present invention.

FIG. 9C, which is a schematic illustration of an alternative inspection mode operation in accordance with an embodiment of the present invention.

FIG. 9E is a schematic illustration of an alternative inspection mode operation in accordance with an embodiment of the present invention.

FIG. 10 is a schematic illustration of throughput of the default and alternative inspection mode operation in accordance with an embodiment of the present invention.

DESCRIPTION OF THE PREFERRED EMBODIMENTS

The present invention generally relates to defect inspection of semiconductor wafer or mask. More particularly, an apparatus and method is provided for calculating and adjusting the stage moving speed and/or corresponding scan compensation offset. By example, the invention is applied to a charged particle beam inspection system. But it would be recognized that the invention has a much broader range of applicability.

Reference will now be made in detail to specific embodiments of the present invention. Examples of these embodiments are illustrated in accompanying drawings. While the invention will be described in conjunction with these specific embodiments, it will be understood that it is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, a well known process and operations have not been described in detail, in order not to unnecessarily obscure the present invention.

Figure 4:
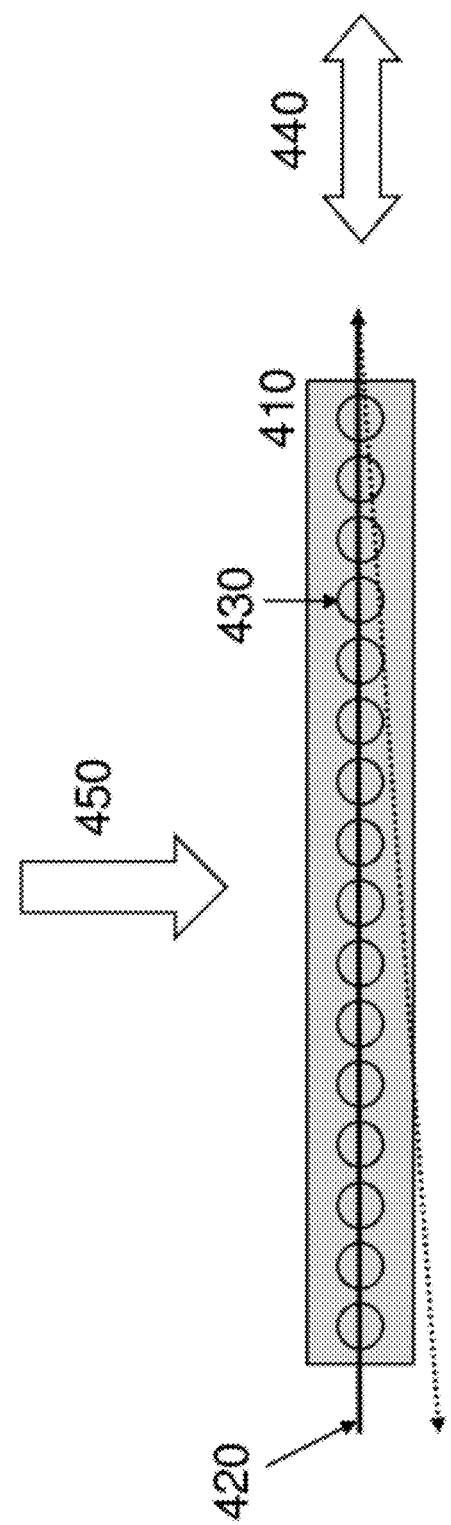
FIG. 4 is a schematic illustration of the relative motion of the scanning beam and the sample stage in accordance with an embodiment of the present invention.

In an embodiment, the stage moving direction and the charged particle beam scanning direction is designed to be at an angle. Referring to FIG. 4, which illustrates the relative motion of the scanning beam and the sample stage in accordance with an embodiment of the present invention. As shown, a sampling region 410 is being scanned in scan lines 420 by a charged particle beam scanning across a plurality of patterns 430 to be inspected. The scanning direction 440 can be different from the stage moving direction 450. In this embodiment, the scanning direction 440 of the charged particle beam is designed to be substantially perpendicular to the moving direction 450 of the sample stage. In other words, the scan lines 420 formed during inspection will be substantially perpendicular to the track of the moving sample stage. It is also noted that as illustrated, in this embodiment the sampling region 410 has a high aspect ratio shape, with its longer edge substantially parallel to the scanning direction 440.

Figure 5A:
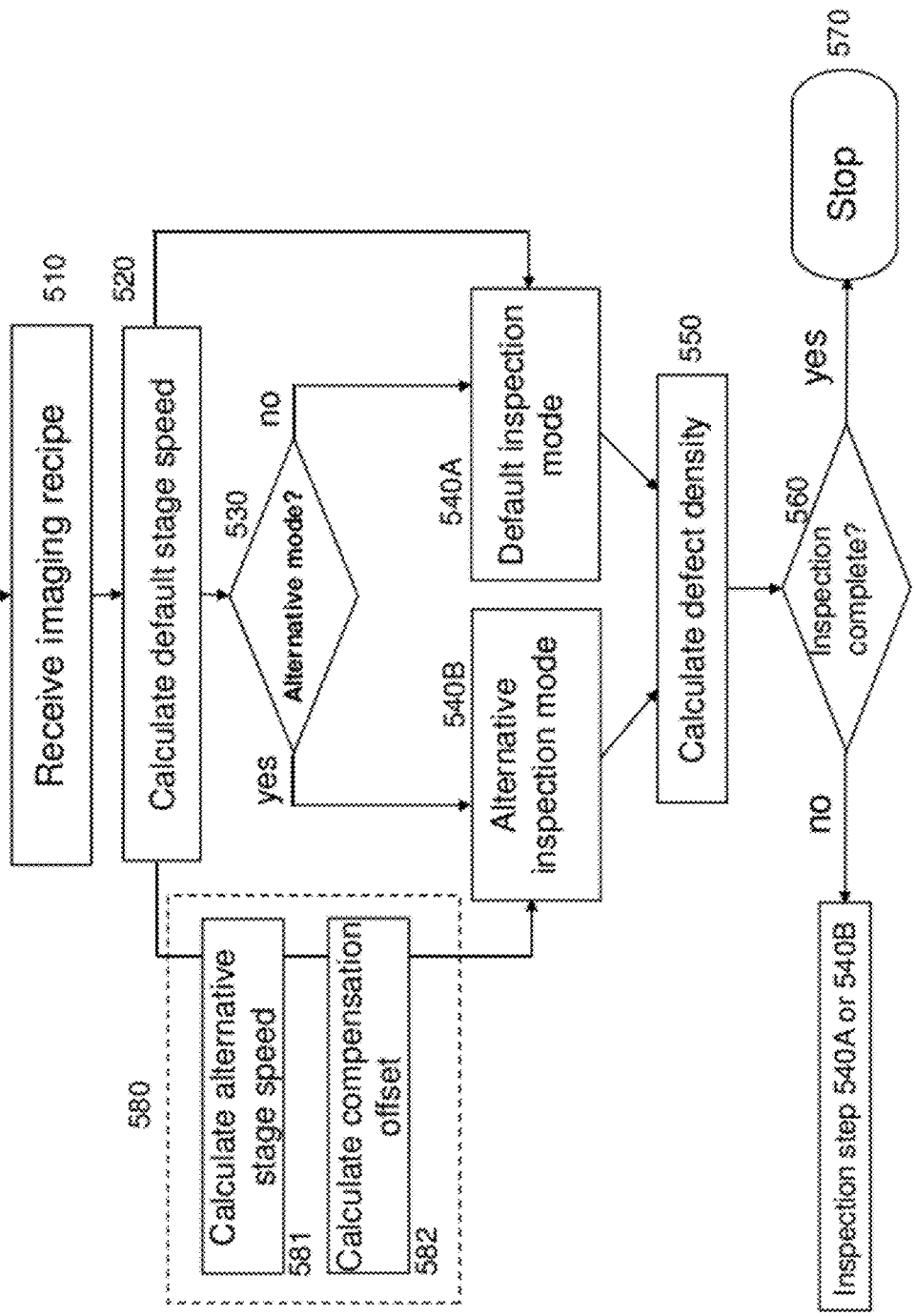
FIG. 5A is a process flowchart illustration of a defect inspection method in accordance with an embodiment of the present invention.

Referring to FIG. 5A, which is a process flowchart illustration of a defect inspection method 500 in accordance with an embodiment of the present invention. This proposed method is to provide improved overall throughput for inspection of a sample having both interested and uninterested regions thereon. As, shown, the proposed method starts by receiving an imaging recipe in step 510. The imaging recipe should at least comprise area information of the sampling and skip region(s). Next, in step 520 a default stage speed is calculated according to the received imaging recipe. Then, in step 530 it is determined if an alternative inspection mode is to be activated. If it is determined that the alternative mode will not be activated, the inspection job will be performed in a default inspection mode at the calculated default stage speed and according to the received imaging recipe, as shown in step 540A.

It is noted that this default mode operation is substantially equal to the conventional art inspection operation, where the sampling and skip regions on the sample are equally scanned and imaged by the imaging charged particle beam. On the other hand, if the determination result indicates activation of the alternative inspection mode, the inspection job will be performed at an alternative stage speed and according to at least one imaging scan compensation offset corresponding to this alternative stage speed, as shown in step 540B. The alternative mode inspection will be described in detail below.

Next, in step 550, the density of inspected defects from step 540A or 540B is calculated. The calculation result is evaluated in step 560 to determine whether it meets satisfaction, so as to determine completion of the inspection process. If the inspection is determined to be incomplete, the process goes back to inspection step 540A or 540B and down. If the inspection is determined to be complete, the process ends at step 570. It is noted that the sampling regions are generally selected in a fashion which complies with the statistical process control rule. Referring to FIG. 5B, which is a flow chart illustration of execution of an alternative inspection mode operation in accordance with an embodiment of the present invention. As shown, the execution of the alternative mode inspection can be summarized as an inspection process flow 590, which comprises: receiving an imaging recipe (510); calculating a default stage speed (520); calculating an alternative stage speed (581); calculating at least one imaging scan compensation offset (582); and inspecting the sample at the alternative stage speed while adjusting the motion of the charged particle beam according to the calculated imaging scan compensation offsets (540B).

The received imaging recipe at least comprises area information of the sampling and skip region. The default stage speed is calculated at least according to the received imaging recipe. The alternative stage speed is calculated at least according to the calculated default stage speed, the sampling region area information, and the skip region area information. The imaging scan compensation offset is calculated at least according to the calculated alternative stage speed. The alternative mode is performed to guide the charged particle beam to tightly follow the motion of the stage and scan and image only the sampling regions on the sample.

In one embodiment, the imaging recipe may also comprise parameters as those in the conventional art, for example the graphical data system (GDS) file of the sample being inspected, the sampling region location information, image pixel size, scan width, image scan time, the largest available image pixel size, the number of scans for individual sampling region, etc. In another embodiment, the imaging recipe may further comprise the location and area information of the skip regions. For these embodiments, the default stage speed, alternative stage speed and imaging scan compensation offsets may be correspondingly calculated according to these more detailed parameters indicated in the imaging recipe.

Figure 6:
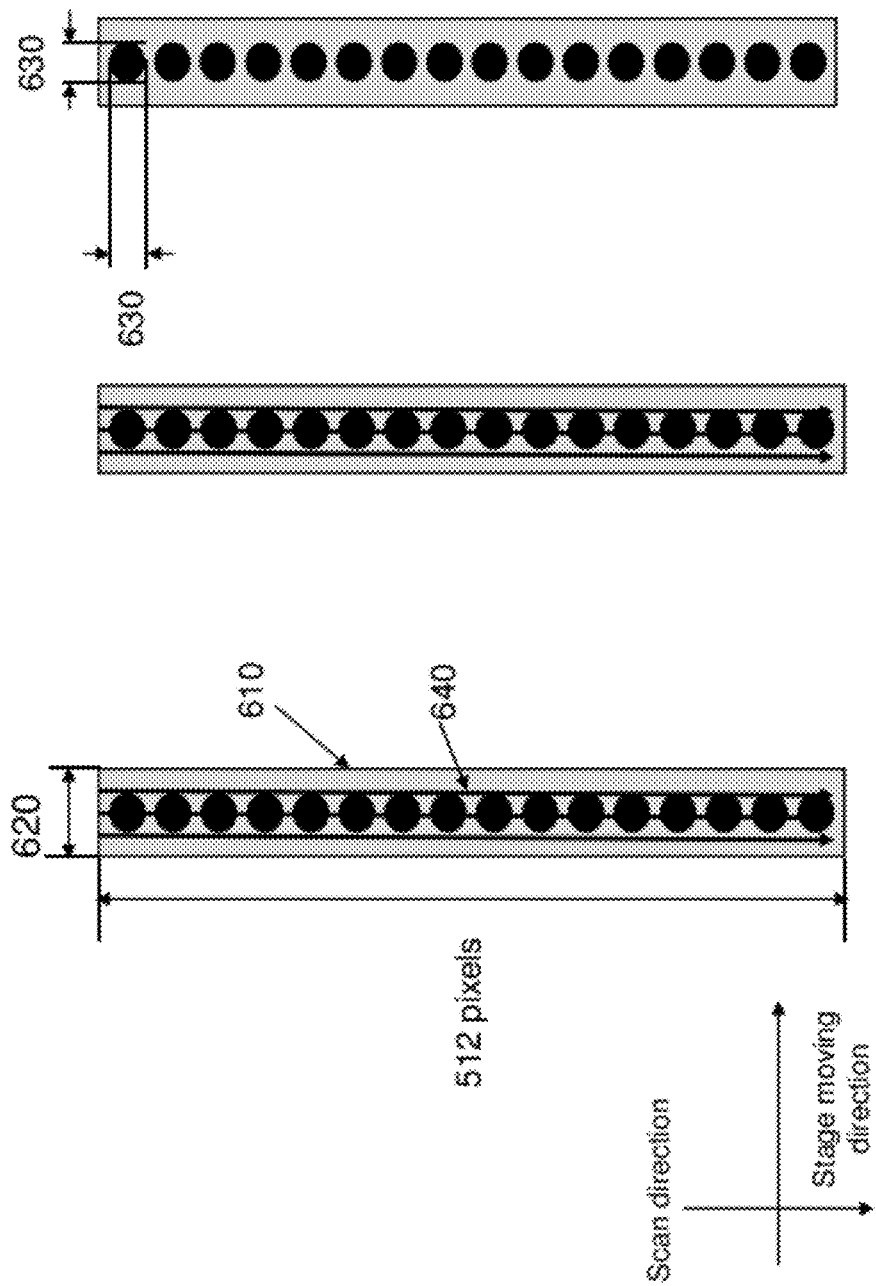
FIG. 6 is a schematic illustration of example imaging recipe parameters in accordance with an embodiment of the present invention.

Reference will now be temporarily made to FIG. 6, which is a schematic illustration of example imaging recipe parameters in accordance with an embodiment of the present invention. As shown, a sampling region 610 comprising for example 512 pixels is being scanned by a charged particle beam. Each sampling region 610 is scanned and imaged with a pre-selected scan width 620 and pixel size 630. The image width 620 is a pre-selected linear distance from the start to the end point of a predefined imaging area along the stage moving direction, wherein the imaging area encompasses sampling region 610.

The image width 620 typically measures in pixels. As the charged particle beam scans down and across the pixels in sampling region 610, it forms scan lines 640. The time required to form one scan line 640 is typically referred to as a line period time at a fixed vertical scanning speed of the charged particle beam. For example, in FIG. 6 the line period time is the time to complete a vertical scan line 640 of 512 pixels at a given scanning speed. With this time length, an image scan time can be defined as the time required to complete the scan of one sampling region 610. In the case shown in FIG. 6, the image scan time is three times the line period time (without averaging), as the illustrated image width 620 is 3 pixels.

Reference is now made back to FIG. 5. Step 580 illustrates the needed steps prior to performing the alternative inspection mode. First, in step 581 the alternative stage speed is calculated at least according to the area of the sampling and skip region indicated in the imaging recipe. For example, the alternative stage speed may be calculated according to a ratio between the area of the sampling region and the skip region, such as a ratio of the skip region area to the sampling region area. This can be better illustrated in conjunction with FIG. 7, which is a schematic illustration of determination of alternative stage speed in accordance with one embodiment of the present invention. As shown, a pattern 700 with a sampling region 710 (AB) and skip region 720 (AC) are being scanned and imaged. In this embodiment, the default stage speed is defined and calculated from the pixel size and line period time given in the imaging recipe according to the following formula:

$$V_{default} = (\text{Pixel Size})/(\text{Line period Time}) \quad (1)$$

The alternative stage speed can be defined, for example, as $$V_{alternative} = V_{default} \times AC/AB \quad (2)$$

Therefore, the alternative stage speed is determined essentially based on the area of the sampling region 710 and the skip region 720. As a result, the stage moving speed is raised by a factor of AC/AB in the alternative inspection mode. In one embodiment, the alternative stage speed can be calculated further according to other factors, such as one selected from a group consisting of the following: image pixel size, scan width, image scan time, the location of the sampling region, the location of the skip region, the largest available image pixel size, the number of scans for individual sampling region, etc., or any combination thereof.

Referring back to FIG. 5A/5B, next in step 582, at least one imaging scan compensation offset is calculated according to the calculated alternative stage speed. It is noted that in one embodiment, the imaging scan compensation offsets can also be calculated further according to other factors such image pixel size, scan width, image scan time, the location of the sampling region, the area of the sampling region, the location of the skip region, the area of the skip region, the largest available image pixel size, the number of scans for individual sampling region, etc., or any combination thereof. With these parameters, the alternative inspection mode is able to be performed in step 540B, where the sample is inspected at the calculated alternative stage speed while the motion of the charged particle beam is adjusted according to the calculated imaging scan compensation offsets, such that the charged particle beam tightly follows the motion of the stage and scans and images only the sampling regions on the sample.

In one embodiment, the imaging scan compensation offset at least comprises tilting at least one of the scan lines to the stage moving direction and reassigning a start point for each scan line along the stage moving direction. Referring to FIG. 8, which is a schematic illustration of example compensation offsets in accordance with an embodiment of the present invention. As shown, a sampling region 810 is being scanned in both the default and alternative mode inspection, respectively.

It is noted that in FIG. 8, the scan direction is substantially pointing to the right of the drawings, and the stage moving direction is substantially pointing to the bottom of the drawings. It is also noted that the scan direction in both scenarios illustrated in FIG. 8 is substantially perpendicular to the stage moving direction. Moreover, the tilted scan direction in the alternative mode has been exaggerated for more explicit illustration.

Span 820A and 820B respectively represents one complete frame image of sampling region 810 in the default and alternative mode inspection. In the alternative mode, the stage is moving at a higher speed, therefore the beam deflector system needs to guide the scanning beam to tightly follow the motion of the stage so as to make useful scans. As illustrated, to achieve such goal two compensation offsets are used in this embodiment, which are tilting of scan line (830) and reassignment of scan line start point (840).

In the default inspection mode, the sample stage moves at a slower speed, and a milder slope of the scan lines is enough for sampling region 810 to be covered by a scan line within a given line period time. In the alternative inspection mode however, as the sample stage moves at a higher speed, assuming the line period time remains unchanged, the sampling region 810 could move out of the coverage of a scan line within a line period time if the scan line slope also remains unchanged.

In order to solve this problem, compensation offset 830 is used to tilt at least one of the scan lines to the direction of the moving stage, thereby rendering a greater slope of the scan line and thus a larger coverage of scan within the same line period time. In addition, with compensation offset 840, the start point of each scan line is reassigned to jump forward at a greater interval as compared to that in the default inspection mode, allowing the scan lines a faster catch-up with the moving sample.

As a result, it can been seen in FIG. 8 that over a same time length of 4 line period time, a frame image of the sampling region 810 is almost complete in the alternative inspection mode, while that in the default inspection mode is less than half complete.

Referring to FIG. 9A, which is a schematic illustration of a default inspection mode operation in accordance with an embodiment of the present invention. As shown, a pattern 900 is being inspected. The pattern 900 comprises a sampling region 910 with an area size AB and a skip region 920 with an area size BC. In this embodiment, the sampling region 910 and skip region 920 have identical area size (AB=BC). A pixel size 940 is selected to be as illustrated in the drawing.

The sample stage is selected to be moving at a speed of 1× to the right. This (default) stage speed is calculated in accordance with formula (1) described earlier, where the needed parameters such as the line period time may be, for example, obtained from the imaging recipe. As a result, the sample stage is traveling over a distance of 1 pixel size to the right per line period time.

In taking the image, one frame image is set to cover the entire sampling region 910 or the skip region 920. As shown, it takes four scan lines (the solid/dotted arrows pointing to the bottom of the drawing) to form a frame image. The circles in sampling region 910 represent patterns under inspection. The dotted arrow represents a pattern being scanned; the solid arrow represents a scanned pattern.

In FIG. 9A, scenes 1~4 illustrate the formation of a complete frame image, and scene 5 illustrates a successive scan line falling in the skip region 920.

Referring to FIG. 9B, which is a schematic illustration of an alternative inspection mode operation in accordance with an embodiment of the present invention. The same pattern 900 as in FIG. 9A is being inspected. The same pixel size 940 is used. The sample stage is selected to be moving at a speed of 2× to the right. In other words, this (alternative) stage speed is selected to be twice the default stage speed with all other imaging recipe parameters unchanged, including the line period time. As a result, the stage is traveling over a distance of 2 pixel sizes to the right per line period time.

The alternative stage speed can be selected based on varying factors. In this embodiment, the alternative stage speed is selected to be doubled because the area of sampling region 910 is only half of the area of the whole sample 900 due to the presence of skip region 920 which has the same area as the sampling region 910. One frame image is still set to cover the entire sampling region 910. As shown, it takes four scan lines to form a frame image. The dotted arrow represents a pattern being scanned; the solid arrow represents a scanned pattern. The circles in sampling region 910 represent patterns under inspection. An imaging scan compensation offset 950 is used to guide the scanning beam in forming the scan lines.

In order to keep the pixel size unchanged, a following scan line must always be formed one pixel behind the previous one. Therefore, the start point of scan lines must be set to be jumping forward a distance of 1 pixel size 940 over one line period time as the stage is traveling at a speed of 2 pixel sizes 940 per line period time. In other words, the compensation offset 950 is set to be 1 pixel size per line period time. It is noted that in FIG. 9B only the start point reassignment type of compensation offset is illustrated.

Scenes 1~4 illustrate the formation of a complete frame image. As shown, for each sequential scene, the stage moves forward 2 pixel sizes 940, and the scan line start point moves forward 1 pixel size 940 as instructed by the compensation offset 950. As a result, the scanning beam constantly keeps up with the moving stage and forms a scan line right on the next pattern column. For example, in scene 1 the first pattern column is scanned. Here, a base line 960 will be used as a reference for illustrating the compensation offset 950.

In scene 2, the first scanned pattern column moves forward 2 pixel sizes 940 with respect to the base line 960. At the same time, the start point of the next scan line moves forward 1 pixel size 940, whereby the second pattern column in sampling region 910 is scanned. Without compensation offset 950, this scan would still be made at the location of the base line 960, forming the second scan line on the third pattern column of sampling region 910, and the second pattern column is thus missed.

Next, in scene 3 the first scanned pattern column moves forward 2 pixel sizes 940 again. At the same time, the scan line start point also moves forward 1 pixel size 940, causing a third scan line to be formed on the third pattern column of the same sampling region 910. The same process proceeds till all the four pattern columns of sampling region 910 are scanned in scene 4, completing a frame image.

In scene 5, the start point of the next scan line is guided to jump backward, skipping the coming up skip region 920, to base line 960. At the same time, the first pattern column of the next sampling region 910 also arrives at base line 960, thus initiating the above cycle process again. In one embodiment, this jumping-back action of the scan line start point is incorporated in compensation offset 950. The compensation offset-applied scan of the next sampling region 910 then proceeds, as shown in scene 6.

Referring to FIG. 9C, which is a schematic illustration of an alternative inspection mode operation in accordance with an embodiment of the present invention. As mentioned earlier, the sample (or say its pattern) being inspected could have sampling and skip regions of varying area sizes.

In FIG. 9C, a pattern 901 comprises a sampling region 911, a first skip region 921 and a second skip region 931. Sampling region 911 has an area size of AB. The first skip region 921 has an area size of BC which equals to AB. The second skip region 931 however, has an area size of DE which is three times of AB.

In this embodiment, the sample stage moves to the right at a varying speed. When region BD is being inspected, the stage moves at a speed of 2×. When the inspection is to be performed on region DF, the stage is set to move at a speed of 3×. At the same time, the compensation offset is set to vary accordingly, so as to deliver proper scan for both regions BD and DF.

It is noted that in this embodiment, information of the location of skip regions 921 and 931 on the sample is critical for calculating the varying alternative stage speeds and associate compensation offsets. This skip region location information may be obtained from the imaging recipe.

Figure 9D:
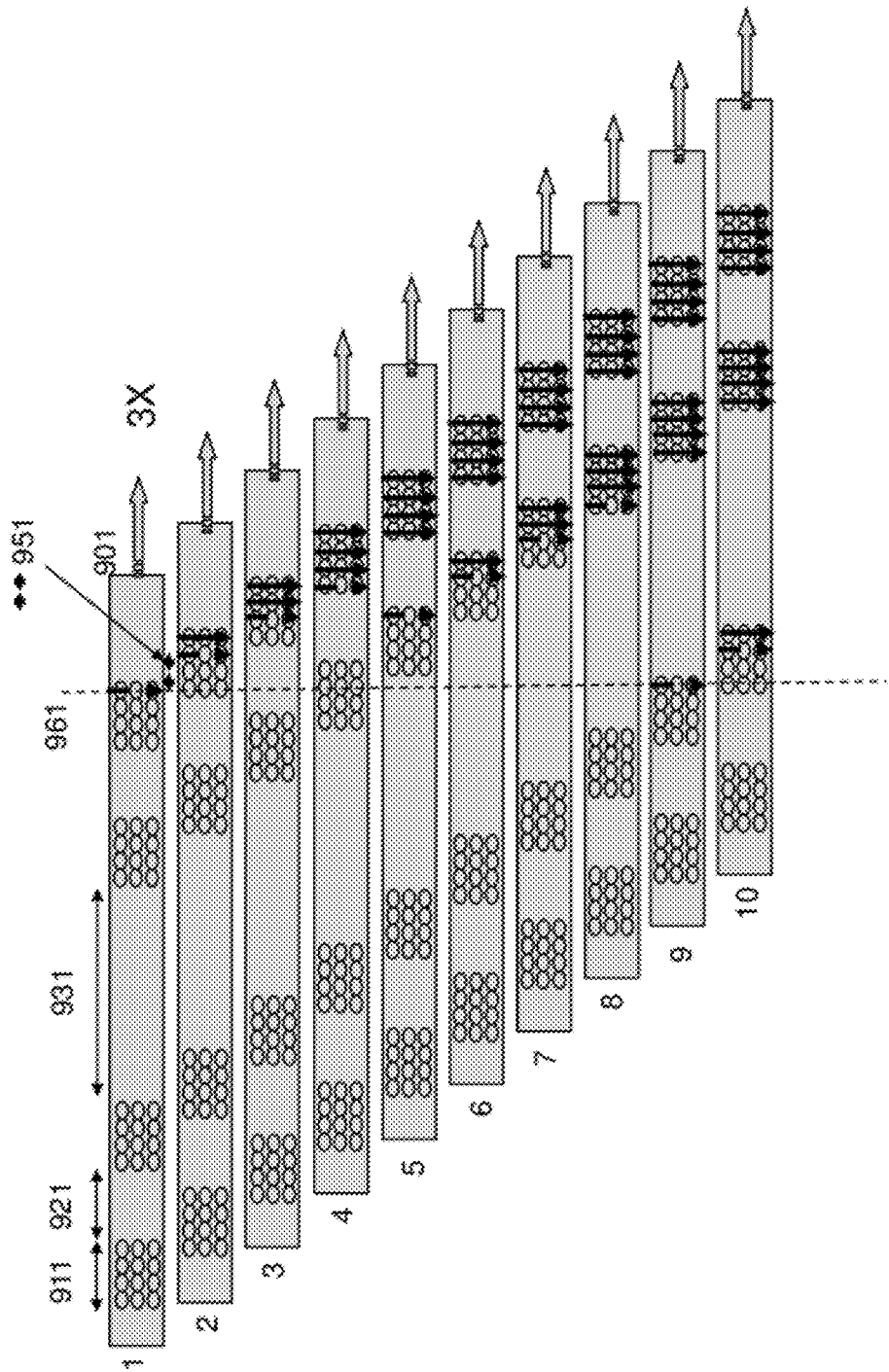
FIG. 9D is a schematic illustration of an alternative inspection mode operation in accordance with an embodiment of the present invention.

Referring to FIG. 9D, which is a schematic illustration of an alternative inspection mode operation in accordance with an embodiment of the present invention. The same pattern 901 as in FIG. 9C is being inspected. The sample stage is selected to be moving at a speed of 3× i.e. the stage moves three pixel sizes to the right per line period time. The compensation offset is set to be 951 which is 2 pixel sizes to the right per line period time, as shown. The start point of scan lines thus tightly follows the moving stage, rendering formation of the successive scan lines on the corresponding successive pattern columns in sampling region 911.

In this embodiment, one frame image is set to cover one sampling region 911. Scenes 1~4 illustrate the formation of a first frame image. Scenes 5~8 illustrate the formation of a second frame image. As shown, in scene 5, while the stage is fast moving to the right, the scan line start point is guided to jump back (to the left) a certain distance to catch the next sampling region 911. And in scene 9, the scan line start point is guided to jump back again to base line 961. In one embodiment, these back-jumping actions are incorporated in compensation offset 951.

Referring to FIG. 9E, which is a schematic illustration of an alternative inspection mode operation in accordance with an embodiment of the present invention. The same pattern 901 as in FIG. 9C is being inspected. The sample stage is selected to be moving at a speed of 2× i.e. the stage moves 2 pixel sizes to the right per line period time. The compensation offset is set to be 952 which is 1 pixel size to the right per line period time, as shown. A base line 961 is used for illustrating the compensation offset 952.

Scenes 1~4 illustrate the formation of a first frame image. Scenes 5~8 illustrate the formation of a second frame image. Scene 13 illustrates the beginning of the formation of a third frame image. Scenes 9~12 illustrate another type of the imaging scan compensation offset, which is a delay of the scanning action. Different from FIG. 9D, in this embodiment the stage is moving at a slower speed.

As a result, in scene 9 when the next scan (i.e. for the formation of the third frame image) is due, the third sampling region 911 has not been able to make it to base line 961. A possible method to help in such situation is to set compensation offset 952 to allow a larger jump-back distance for the scan line start point. However, the increase in this distance is limited by the deflector's physical design as the scanning beam is guided by the deflector to scan the designated position on the sample.

Therefore, another method is used in this embodiment, which is to delay the scanning action for a certain period of time. This is illustrated in scenes 9~12 where no new scan line is formed at all. For example, the scanning beam can be idled or blanked, waiting the next sampling region 911 to come closer to base line 961. Then, the scanning action is resumed and the next scan line is formed in scene 13, initiating the formation of the third frame image. In one embodiment, this delayed scanning action is incorporated in compensation offset 952.

It is noted that although the above embodiments described in conjunction with FIG. 9A~9E are designed to handle a pattern having a constant sampling region area along with a varying skip region area, it would be obvious to those skilled in the art that alternatives of the above designs can also be applied to scenarios where the sampling region area or both the sampling and skip region areas are changing as well.

Referring to FIG. 10, which is a schematic illustration of throughput of the default and alternative inspection mode operation in accordance with an embodiment of the present invention. As shown, the alternative mode inspection is performed in a scan-skip-scan fashion whereby only the sampling regions are scanned and imaged. The default mode on the other hand, equally scans and images both the sampling and skip region.

It is noted that in one embodiment of the present invention, the default mode inspection is substantially equivalent to the conventional art inspection operation. A processed image 1001 and 1002 from the alternative and default mode, respectively, are illustrated for comparison. It can be seen that the time needed to form 3 frames of image is shorter in the alternative mode than in the default mode.

The proposed method can be practiced in the form of an executing code or a computing program. The code or program can be implemented in pure hardware, firmware, pure software, or combination thereof. For example, the method may be coded in an embedded computing device or as part of a control system. Or the method can be written in a software application and run on a compatible computing device such as a mainframe host, terminals, personal computers, any kind of mobile computing devices or combination thereof.

In another embodiment, a control module of a charged particle beam inspection system is disclosed, which contains a computer readable medium encoded with the proposed method. This control module is at least coupled to a beam probe deflector module and a sample stage of the charged particle beam inspection system. The beam probe deflector module is used to scan a primary charged particle beam probe across the surface of a sample to be imaged and inspected. The sample sits on the sample stage, and during the charged particle beam inspection the sample stage moves at a certain designated speed while the charged particle beam probe scans the sample.

The control module is implemented such that it is able to perform the proposed method (as described earlier in conjunction with FIG. 4~FIG 10) of the present invention. In one embodiment, the control module is coupled to the beam probe deflector module and the sample stage through a medium selected from a group consisting of the following, or any combination thereof: cable wire, optical fiber cable, portable storage media, IR, Bluetooth, intranet, internet, wireless network, wireless radio, etc.

The control module first receives an imaging recipe loaded into the inspection system. The imaging recipe at least comprises information of the area of a sampling and skip region on the sample. A default stage speed can be calculated in advanced and be included in the imaging recipe received by the control module, or it can be calculated by the control module. The control module then calculates an alternative stage speed and corresponding imaging scan compensation offsets in accordance with the default stage speed and the received imaging recipe. The generation of the alternative stage speed and imaging scan compensation offsets can be based on the proposed method of the present invention as described earlier and will not be repeated here.

The control module then determines whether an alternative inspection mode will be activated. For example, an activation signal can be inputted by the user of the charged particle beam inspection system through a user input means or interface to indicate activation of the alternative mode operation. If the alternative inspection mode is determined not to be activated, the control module generates for example a first control signal to the beam probe deflector module and the sample stage to cause the stage to move at the default stage speed and the deflector module to guide the motion of the primary charged particle beam probe in accordance with the imaging recipe, such that the charged particle beam probe equally scans the and images the sampling and skip regions on the sample.

On the contrary, if the alternative mode is determined to be activated, the control module generates a second control signal to the beam probe deflector module and the sample stage to cause the stage to move at the alternative stage speed and the deflector module to guide the motion of the primary charged particle beam probe in accordance with the imaging scan compensation offsets, such that the charged particle beam probe tightly follows the motion of the sample stage and scans only the sampling regions on the sample. It is noted that the detailed example variations, equivalents and alternatives of the alternative stage speed and compensation offsets that can be used by the control module to carry out the alternative inspection mode have been described in previous embodiments and will not be repeated here.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A method for imaging and inspecting a sample using a charged particle beam, said sample comprising at least one sampling region and at least one skip region thereon, said charged particle beam scanning said sample in scan lines along a first direction, said sample being secured on a stage continuously moving along a second direction, the method comprising:

receiving an imaging recipe at least comprising a sampling region area information and skip region area information;

calculating a default stage speed according to received said imaging recipe;

calculating an alternative stage speed according to calculated said default stage speed, said sampling region area information, and said skip region area information, wherein said alternative stage speed is different from said default stage speed;

calculating at least one imaging scan compensation offset according to calculated said alternative stage speed; and inspecting said sample at said alternative stage speed while adjusting the motion of said charged particle beam according to calculated said imaging scan compensation offsets, such that said charged particle beam tightly follows the motion of said stage and scans and images only said sampling regions on said sample.

2. The method of claim 1, wherein said imaging scan compensation offsets at least comprise tilting at least one of said scan lines to said second direction and reassigning a start point for each said scan line along said second direction.

3. The method of claim 2, wherein said imaging scan compensation offsets further comprise one selected from a group consisting of the following, or any combination thereof:

rendering a jump-back action of said start point of said scan lines, rendering a delay of scan for a predefined time period.

4. The method of claim 1, wherein said alternative stage speed varies during inspection of entire said sample.

5. The method of claim 1, wherein said imaging scan compensation offsets vary during inspection of entire said sample.

6. The method of claim 1, wherein said alternative stage speed is calculated further according to one selected from a group consisting of the following, or any combination thereof: image pixel size, scan width, image scan time, sampling region location information, skip region location information, the largest available image pixel size, the number of scans for individual sampling region.

7. The method of claim 1, wherein said imaging scan compensation offset is calculated further according to one selected from a group consisting of the following: image pixel size, scan width, image scan time, sampling region location information, sampling region area information, skip region location information, skip region area information, the largest available image pixel size, the number of scans for individual sampling region, or any combination thereof.

8. A computer readable medium encoded with a program for enhancing throughput of charged particle beam inspection of a sample, said sample comprising at least one sampling region and at least one skip region thereon, said charged particle beam scanning said sample in scan lines along a first direction, said sample being secured on a stage continuously moving along a second direction, said program executing actions on a computer comprising:

receiving an imaging recipe at least comprising a sampling region area information and skip region area information;

calculating a default stage speed according to received said imaging recipe;

calculating an alternative stage speed according to calculated said default stage speed, said sampling region area information, and said skip region area information, wherein said alternative stage speed is different from said default stage speed;

calculating at least one imaging scan compensation offset according to calculated said alternative stage speed; and determining activation of an alternative inspection mode, wherein if said alternative inspection mode is determined to be activated, then inspecting said sample at said alternative stage speed while adjusting the motion of said charged particle beam according to calculated said imaging scan compensation offsets, such that said charged particle beam tightly follows the motion of said stage and scans and images only said sampling regions on said sample.

9. The computer readable medium of claim 8, wherein said imaging scan compensation offsets at least comprise tilting at least one of said scan lines to said second direction and reassigning a start point for each said scan line along said second direction.

10. The computer readable medium of claim 9, wherein said imaging scan compensation offsets further comprise one selected from a group consisting of the following, or any combination thereof: rendering a jump-back action of said start point of said scan lines, rendering a delay of scan for a predefined time period.

11. The computer readable medium of claim 8, wherein said determination step is performed by detecting an activation signal of said alternative inspection mode.

12. The computer readable medium of claim 8, further comprising if said alternative inspection mode is determined not to be activated, then inspecting said sample at said default stage speed while adjusting the motion of said charged particle beam according to said imaging recipe, such that said charged particle beam equally scans and images said sampling and skip regions on said sample.

13. The computer readable medium of claim 8, wherein said alternative stage speed is constant during inspection of entire said sample.

14. The computer readable medium of claim 8, wherein said alternative stage speed varies during inspection of entire said sample.

15. The computer readable medium of claim 8, wherein said imaging scan compensation offsets remain the same during inspection of entire said sample.

16. The computer readable medium of claim 8, wherein said imaging scan compensation offsets vary during inspection of entire said sample.

17. The computer readable medium of claim 8, wherein said imaging recipe further comprises one selected from the group consisting of the following, or any combination thereof: image pixel size, scan width, image scan time, sampling region location information, skip region location information, the largest available image pixel size, the number of scans for individual sampling region.

18. The computer readable medium of claim 8, wherein said alternative stage speed is calculated further according to one selected from a group consisting of the following, or any combination thereof: image pixel size, scan width, image scan time, sampling region location information, skip region location information, the largest available image pixel size, the number of scans for individual sampling region.

19. The computer readable medium of claim 8, said imaging scan compensation offset is calculated further according to one selected from a group consisting of the following: image pixel size, scan width, image scan time, sampling region location information, sampling region area information, skip region location information, skip region area information, the largest available image pixel size, the number of scans for individual sampling region, or any combination thereof.

20. The computer readable medium of claim 8, wherein said sampling regions are separated from one another by at least one said skip region.

21. The computer readable medium of claim 8, wherein said skip regions comprise a no-pattern region.

22. The computer readable medium of claim 8, wherein said sampling and skip regions form a repeating pattern on said sample.

23. The computer readable medium of claim 8, wherein said sampling and skip regions form an irregular pattern on said sample.

24. The computer readable medium of claim 8, wherein said sampling region has a high aspect ratio shape.

25. The computer readable medium of claim 8, wherein said sample is a flash memory cell.

26. A charged particle beam inspection system for imaging and inspecting a sample, said sample comprising at least one sampling region and at least one skip region thereon, the system comprising:
  a charged particle beam probe generator for generating a charged particle beam probe;
  a deflection module for scanning generated said charged particle beam probe across a surface of said sample, wherein said charged particle beam probe scans said sample in scan lines along a first direction;
  a moving stage on which said sample is secured for imaging, wherein said stage continuously moves along a second direction;
  a control module coupled with said stage and said deflection module for matching the relative motion of said stage and said charged particle beam probe, wherein said control module performs the following actions:
  receiving an imaging recipe at least comprising a sampling region area information and skip region area information;
  calculating a default stage speed according to received said imaging recipe;
  calculating an alternative stage speed according to calculated said default stage speed, said sampling region area information, wherein said alternative stage speed is different from said default stage speed;
  calculating at least one imaging scan compensation offset according to calculated said alternative stage speed and generating a first control signal and a second control signal accordingly; and
  determining activation of an alternative inspection mode, wherein if said alternative inspection mode is determined to be activated, then said control module outputs generated said second control signal to said stage and deflection module to cause said stage to move at said alternative stage speed and said deflection module to guide said charged particle beam probe in accordance with said imaging scan compensation offsets, such that said charged particle beam probe tightly follows the motion of said stage and scans and images only said sampling regions on said sample.

27. The charged particle beam inspection system of claim 26, wherein said imaging scan compensation offsets at least comprise tilting at least one of said scan lines to said second direction and reassigning a start point for each said scan line along said second direction.

28. The charged particle beam inspection system of claim 27, wherein said imaging scan compensation offsets further comprise one selected from a group consisting of the following, or any combination thereof: rendering a jump-back action of said start point of said scan lines, rendering a delay of scan for a predefined time period.

29. The charged particle beam inspection system of claim 26, if said alternative inspection mode is determined not to be activated, then said control module outputs generated said first control signal to said stage and deflection module to cause said stage to move at said default stage speed and said deflection module to guide said charged particle beam in accordance with said imaging recipe, such that said charged particle beam equally scans and images said sampling and skip regions on said sample.

30. The charged particle beam inspection system of claim 26, wherein said determination step is performed by detecting an activation signal of said alternative inspection mode.

31. The charged particle beam inspection system of claim 30, further comprising a user input means coupled with said control module, wherein said user input means is used for receiving user input of said activation signal.

32. The charged particle beam inspection system of claim 26, wherein said control module is coupled to said stage and said deflection module through a medium selected from a group consisting of the following, or any combination thereof: cable wire, optical fiber cable, portable storage media, IR, Bluetooth, intranet, internet, wireless network, wireless radio.

33. The charged particle beam inspection system of claim 26, wherein said control module is implemented as one selected from a group consisting of the following: a mainframe host, a terminal computer, a personal computer, any kind of mobile computing devices, or combination thereof.

34. A method for inspecting a sample using a charged particle beam, said sample comprising a plurality of sampling regions and a plurality of skip regions, said method comprising:
  receiving an imaging recipe comprising a first area information of said plurality of sampling regions and a second area information of said plurality of skip regions;
  calculating a default stage speed according to said imaging recipe;
  calculating an alternative stage speed according to said default stage speed, said first area information, and said second area information, wherein said alternative stage speed is different from said default stage speed; and
  scanning said plurality of sampling regions by deflecting said charged particle beam to match said alternative stage speed.

35. The method of claim 34, wherein said alternative stage speed is fixed.

36. The method of claim 34, wherein said alternative stage speed is varied according to said first information, and said second information during inspection of entire said sample.

* * * * *